(12) United States Patent
Ishibashi et al.

(10) Patent No.: US 6,867,112 B1
(45) Date of Patent: Mar. 15, 2005

(54) METHOD OF FABRICATING NITRIDE SEMICONDUCTOR DEVICE

(75) Inventors: Akihiko Ishibashi, Sakai (JP); Isao Kidoguchi, Kawanishi (JP); Kenji Harafuji, Hirakata (JP); Yuzaburo Ban, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/692,211

(22) Filed: Oct. 20, 2000

(30) Foreign Application Priority Data

Oct. 21, 1999 (JP) .......................................... 11-299640

(51) Int. Cl.[7] .............................................. H01L 21/20
(52) U.S. Cl. ......................... 438/479; 438/483; 438/46
(58) Field of Search .................... 438/22–47, 479–509, 438/475

(56) References Cited

U.S. PATENT DOCUMENTS

| | | | | |
|---|---|---|---|---|
| 5,290,393 A | * | 3/1994 | Nakamura | |
| 5,637,531 A | * | 6/1997 | Porowski et al. | 117/89 |
| 5,787,104 A | | 7/1998 | Kamiyama et al. | |
| 5,834,331 A | * | 11/1998 | Razeghi | 438/40 |
| 5,926,726 A | * | 7/1999 | Bour et al. | 438/507 |
| 6,023,077 A | * | 2/2000 | Iyechika et al. | 257/103 |
| 6,030,848 A | * | 2/2000 | Yuge et al. | 438/46 |
| 6,031,858 A | * | 2/2000 | Hatakoshi et al. | 372/46 |
| 6,060,335 A | * | 5/2000 | Rennie et al. | 438/46 |
| 6,430,202 B1 | * | 8/2002 | Van De Walle et al. | 372/45 |
| 2002/0022290 A1 | * | 2/2002 | Kong et al. | 438/48 |

FOREIGN PATENT DOCUMENTS

| | | | |
|---|---|---|---|
| EP | 0 887 436 | | 12/1998 |
| FR | 2769924 | * | 4/1999 |
| JP | 06-177423 | | 6/1994 |
| JP | 06-196757 | | 7/1994 |
| JP | 07-235505 | | 9/1995 |
| JP | 08-255932 | | 10/1996 |
| JP | 08-316141 | | 11/1996 |
| JP | 09-186363 | | 7/1997 |
| JP | 09-213998 | | 8/1997 |
| JP | 2702889 | | 10/1997 |
| JP | 10-182282 | | 7/1998 |
| JP | 11-074203 | | 3/1999 |

OTHER PUBLICATIONS

N. Yoshimoto et al., Photoluminescence of InGaN films grown at high temperature by metalorganic vapor phase epitaxy, Appl. Phys. Lett. 59 (18), pp. 2251–2253, Oct. 28, 1991.

S. Nakamura et al., "InGaN–Based Multi–Quantum–Well–Structure Laser Diodes", Jpn. J. Appl. Phys. vol. 35, pf. 2, No. 1B, pp. L74–L76, Jan. 15, 1996.

K. Yanashima et al., "Room–Temperature Continuous–Wave Operation of GaN–Based Laser Diodes Grown by Raised–Pressure Metalorganic Chemical Vapor Deposition", Journal of Electronic Materials, vol. 28, No. 3, pp. 287–289, 1999.

(List continued on next page.)

*Primary Examiner*—Savitri Mulpuri
(74) *Attorney, Agent, or Firm*—McDermott Will & Emery LLP

(57) ABSTRACT

The method of fabricating a nitride semiconductor device of this invention includes plural steps of respectively growing plural nitride semiconductor layers on a substrate; and between a step of growing one nitride semiconductor layer and a step of growing another nitride semiconductor layer adjacent to the one nitride semiconductor layer among the plural steps, a step of changing a growth ambient pressure from a first growth ambient pressure to a second growth ambient pressure different from the first growth ambient pressure.

3 Claims, 11 Drawing Sheets

OTHER PUBLICATIONS

Miyake et al., "Effects of Reactor Pressure on Epitaxial Lateral Overgrowth of GaN via Low–Pressure Metalorganic Vapor Phase Epitaxy", pp. L1000–L1002, Sep. 15, 1999, Jpn. J. Appl. Phys., vol. 38, Part 2, No. 9A/B.

Nakamura et al., "AlN and AlGaN Growth Using Low--Pressure Metalorganic Chemical Vapor Deposition", pp. 280–285, 1998, Journal of Crystal Growth 195.

Mihopoulos, et al., "A Reaction–Transport Model for AlGaN MOVPE Growth", pp. 733–739, 1998, Journal of Crystal Growth 195.

Lee et al., "Characteristics of In Ga N/GaN Grown by LPMOVPE with the Variation of Growth Temperature", pp. 6–10, 1997, Journal of Crystal Growth 182.

* cited by examiner

US 6,867,112 B1

METHOD OF FABRICATING NITRIDE SEMICONDUCTOR DEVICE

BACKGROUND OF THE INVENTION

The present invention relates to a method of fabricating a nitride semiconductor device such as a semiconductor laser diode expected to be applied to the fields of optical information processing and the like.

Recently, a nitride semiconductor of a group III-V compound, that is, a compound including nitride (N) as a group V element, is regarded as a promising material for a short-wavelength light emitting device due to its large energy gap. In particular, a gallium nitride-based compound semiconductor ($Al_xGa_yIn_zN$, wherein $0 \leq x, y, z \leq 1$ and $x+y+z=1$) has been earnestly studied and developed, resulting in realizing a practical blue or green light emitting diode (LED) device. Furthermore, in accordance with capacity increase of an optical disk unit, a semiconductor laser diode lasing at a wavelength of approximately 400 nm is earnestly desired, and a semiconductor laser diode using a gallium nitride-based semiconductor is to be practically used.

Now, a conventional gallium nitride-based semiconductor laser diode will be described with reference to a drawing.

FIG. 11 shows the sectional structure of the conventional gallium nitride-based semiconductor laser diode showing laser action. As is shown in FIG. 11, the conventional semiconductor laser diode includes a buffer layer 302 of gallium nitride (GaN), an n-type contact layer 303 of n-type GaN, a first cladding layer 304 of n-type aluminum gallium nitride (AlGaN), a first light guiding layer 305 of n-type GaN, a multiple quantum well (MQW) active layer 306 including gallium indium nitride layers having different composition ratios of indium ($Ga_{1-x}In_xN/Ga_{1-y}In_yN$ wherein $0<y<x<1$), a second light guiding layer 307 of P-type GaN, a second cladding layer 308 of p-type AlGaN and a p-type contact layer 309 of p-type GaN successively formed on a substrate 301 of sapphire by, for example, metal organic vapor phase epitaxial growth (MOVPE).

An upper portion of the second cladding layer 308 and the p-type contact layer 309 are formed into a ridge with a width of approximately 3 through 10 μm. A lamination body including the MQW active layer 306 formed on the semiconductor substrate 301 is etched so as to expose part of the n-type contact layer 303, and the top face and the side faces of the etched lamination body are covered with an insulating film 310. In a portion of the insulating film 310 above the p-type contact layer 309, a stripe-shaped opening is formed, and a p-side electrode 311 in ohmic contact with the p-type contact layer 309 through the opening is formed over a portion of the insulating film 310 above the ridge. Also, on a portion of the n-type contact layer 303 not covered with the insulating film 310, an n-side electrode 312 in ohmic contact with the n-type contact layer 303 is formed.

In the semiconductor laser diode having the aforementioned structure, when a predetermined voltage is applied to the p-side electrode 311 with the n-side electrode 312 grounded, optical gain is generated within the MQW active layer 306, so as to show laser action at a wavelength of approximately 400 nm. The wavelength of the laser action depends upon the composition ratios x and y or the thicknesses of the $Ga_{1-x}In_xN$ and $Ga_{1-y}In_yN$ layers included in the MQW active layer 306. At present, the semiconductor laser diode having this structure has been developed to show continuous laser action at room temperature or more.

It is generally well known that the growth temperature for growing a nitride semiconductor crystal by the MOVPE is changed in accordance with the composition ratio of a group III element introduced into gallium nitride (GaN).

It is reported that, in growing a semiconductor of, for example, gallium indium nitride (GaInN), nitrogen ($N_2$) is preferably used as a material carrier gas with the growth temperature for the semiconductor set to approximately 800° C. (Applied Physics Letters, Vol. 59, pp. 2251–2253, 1991).

On the other hand, it is also known that the first and second cladding layers 304 and 308 and the first and second light guiding layer 305 and 307 not including indium are preferably grown at a growth temperature of 1000° C. or more with hydrogen ($H_2$) used as a carrier gas.

The fabrication processes for these semiconductor layers are disclosed in, for example, Japanese Laid-Open Patent Publication No. 6-196757 or 6-177423.

The outline of the processes will now be described with reference to FIG. 11.

First, with hydrogen introduced onto a substrate 301, the principal plane of the substrate 301 is subjected to a heat treatment at a temperature of approximately 1050° C. Then, after lowering the substrate temperature to approximately 510° C., ammonia ($NH_3$) and trimethylgallium (TMG), that is, mutually reactive gases, are introduced onto the substrate 301, so as to grow a buffer layer 302. Thereafter, with the introduction of TMG stopped, the substrate temperature is increased to approximately 1030° C., and TMG and monosilane ($SiH_4$) are introduced onto the substrate 301 with hydrogen used as a carrier gas, thereby successively growing an n-type contact layer 303, a first cladding layer 304 and a first light guiding layer 305, whereas trimethylaluminum (TMA) is additionally introduced as a group III material gas in growing the first cladding layer 304.

Next, the introduction of the material gases is stopped, the substrate temperature is lowered to approximately 800° C., and the carrier gas is changed to nitrogen. Subsequently, trimethylindium (TMI) and TMG are introduced onto the substrate 301 as the group III material gases, thereby growing a MQW active layer 306.

Then, the introduction of the group III material gases is stopped, the substrate temperature is increased to approximately 1020° C. and a group III material gas, that is, TMG and TMA if necessary, and cyclopentadienylmagnesium ($Cp_2Mg$) including a p-type dopant are introduced onto the substrate 301, thereby successively growing a second light guiding layer 307, a second cladding layer 308 and a p-type contact layer 309.

After growing the MQW active layer 306, as a protection film for the active layer in increasing the temperature from 800° C. to 1020° C., a semiconductor layer of GaN is formed according to the description of Japanese Laid-Open Patent Publication No. 9-186363 or a semiconductor layer of $Al_{0.2}Ga_{0.8}N$ is formed according to description of, for example, Japanese Journal of Applied Physics (Vol. 35, pp. L74–L76, 1996).

In general, the vapor phase epitaxial growth is conducted in an atmosphere of reduced pressure lower than the atmospheric pressure, the atmospheric pressure or increased pressure lower than approximately 1.5 atm.

A technique to suppress defects from occurring on an interface between a substrate and gallium nitride by growing gallium nitride on a substrate of sapphire by selective growth or the like is recently tried. It is reported with respect to this technique that gallium nitride with a flat face and high crystal quality can be obtained by conducting the vapor phase epitaxial growth under reduced pressure in particular.

As described so far, as a characteristic of growth of a gallium nitride-based semiconductor, different carrier gases are used in growing a layer including indium, namely, the MQW active layer 306, and layers not including indium, such as the first cladding layer 304 and the first light guiding layer 305. In general, nitrogen is used for growing the former layer and hydrogen is used for growing the latter layers.

Accordingly, in the fabrication of a semiconductor laser diode, particularly in forming a multilayer structure including double heterojunction layers sandwiching an active layer by the vapor phase epitaxial growth, it is necessary to change the carrier gas before and after forming the active layer. Also, the substrate temperature is changed at the same time. In changing the carrier gas, the introduction of the group III material gases such as TMG is stopped, and the substrate is placed in an equilibrium state where no crystal grows.

However, in the aforementioned conventional method of fabricating a nitride semiconductor device, the crystal face of the grown semiconductor layer is exposed to a high temperature of approximately 1000° C. and reduced pressure lower than 1 atm while the substrate is placed in the equilibrium state where the introduction of the group III material gases is stopped. As a result, there arises a problem that constituent elements are released (re-evaporated) from the crystal face.

In particular, quality degradation of the first cladding layer 304 and the first light guiding layer 305 formed below the MQW active layer 306, particularly the first cladding layer 305 including 10% of aluminum in the aforementioned publication, leads to quality degradation of the MQW active layer 306. This degradation results in lowering the luminous efficiency and degrading operation characteristics, for example, increasing a threshold current, of the resultant light emitting diode or semiconductor laser diode.

Furthermore, it is recently reported in Journal of Electronic Materials (Vol. 28, No. 3, pp. 287–289, 1999) that when gallium nitride is grown under increased pressure, an etch pit density can be reduced so as to suppress point defects.

On the other hand, the present inventors have found the following problem: When a nitride semiconductor is simply grown under increased pressure exceeding the atmospheric pressure in the above-described equilibrium state, the concentration of material gases is so increased that vapor phase reactions of ammonia with trimethylaluminum and cyclopentadienylmagnesium are caused, resulting in producing intermediate reaction products through these intermediate reactions.

Accordingly, the material gases cannot be efficiently supplied onto the growth face of a crystal on the substrate, resulting in extremely lowering the growth rate or preventing magnesium (Mg), that is, the p-type dopant, from being introduced into the crystal.

Furthermore, when the flow rate of a carrier gas for carrying the material gases is increased for avoiding the production of the intermediate reaction product, the amount of gases flowing through a reaction tube is so large that vortexes and convections are caused in the air flow within the reaction tube. As a result, the crystal cannot be grown under stable conditions.

SUMMARY OF THE INVENTION

In consideration of the aforementioned conventional problems, an object of the invention is improving the crystal quality of a nitride semiconductor, particularly the crystal quality of an active region and its vicinity of a semiconductor light emitting device, so as to improve the operation characteristics such as luminous efficiency.

In order to achieve the object, according to the present invention, the growth ambient pressure is changed in growing nitride semiconductors in accordance with the composition ratio of a group III element included in each nitride semiconductor.

Specifically, in fabrication of a nitride semiconductor device, increased pressure is employed in growing a semiconductor layer including an element tending toreevaporate, such as indium, and reduced pressure is employed in growing a semiconductor layer including an element tending to generate an intermediate reaction product, such as aluminum or magnesium.

Furthermore, when epitaxial lateral overgrowth (ELO) is used, reduced pressure is employed in growing a semiconductor layer directly from a seed crystal, and the growth pressure is appropriately set in accordance with the composition ratio of a group III element in growing another semiconductor layer.

Specifically, the first method of fabricating a nitride semiconductor device of this invention comprises plural steps of respectively growing plural nitride semiconductor layers on a substrate; and between a step of growing one nitride semiconductor layer and a step of growing another nitride semiconductor layer adjacent to the one nitride semiconductor layer among the plural steps, a step of changing a growth ambient pressure from a first growth ambient pressure to a second growth ambient pressure different from the first growth ambient pressure.

In the first method of fabricating a nitride semiconductor device, optimal growth ambient pressures can be set in accordance with compositions of the plural stacked nitride semiconductor layers. Therefore, crystal dislocations can be reduced in the nitride semiconductor layers to be grown, the nitride semiconductor layers can be efficiently doped, and a semiconductor crystal of an active layer in particular can be improved in the quality. As a result, the operation characteristics of the semiconductor device can be improved.

In the first method of fabricating a nitride semiconductor device, the first growth ambient pressure or the second growth ambient pressure is preferably a pressure lower than the atmospheric pressure. In this manner, in growing a nitride semiconductor layer including an element tending to produce an intermediate reaction product, the intermediate reaction in a vapor phase between materials can be suppressed without increasing the flow rates of material gases and carrier gases, resulting in stabilizing the growth of the crystal and improving the growth efficiency. Accordingly, the crystal quality can be improved.

In the first method of fabricating a nitride semiconductor device, among the plural nitride semiconductor layers, a nitride semiconductor layer grown under the pressure lower than the atmospheric pressure preferably includes aluminum or magnesium. In general, since a nitride semiconductor layer including aluminum has a larger energy gap and a smaller refractive index than an active layer, such a nitride semiconductor layer is used as a cladding layer for sandwiching the active layer. Accordingly, the crystal quality of semiconductor layers formed in the vicinity of the active layer can be improved so as to improve the crystal quality of the active layer in this invention, and hence, the resultant semiconductor device can attain good operation characteristics. Also, since a nitride semiconductor layer including magnesium generally exhibits a p-type conductivity, a p-type semiconductor layer with good crystallinity can be efficiently obtained.

In the first method of fabricating a nitride semiconductor device, one of the first growth ambient pressure and the second growth ambient pressure is preferably a pressure higher than the atmospheric pressure and the other is a pressure lower than the atmospheric pressure. In this manner, a nitride semiconductor layer grown under the pressure lower than the atmospheric pressure can be improved in its growth efficiency because the production of an intermediate reaction product can be suppressed as described above. In addition, a nitride semiconductor layer grown under the pressure higher than the atmospheric pressure can be improved in its crystal quality even when it includes an element tending to re-evaporate.

In this case, among the plural nitride semiconductor layers, a nitride semiconductor layer grown under the pressure higher than the atmospheric pressure preferably includes indium. Since indium nitride has such a high vapor pressure that nitrogen can be easily re-evaporated during the growth, when the nitride semiconductor layer including indium is thus grown under increased pressure, the re-evaporation of nitrogen can be suppressed.

Also in this case, the nitride semiconductor layer including indium is preferably an active layer. In general, an active layer of a double heterojunction type of a light emitting device is required to have the smallest energy gap and the largest refractive index, and hence, a nitride semiconductor including indium is used as the active layer. Accordingly, the crystal quality of the active layer can be definitely improved in this invention.

In the first method of fabricating a nitride semiconductor device, the step of growing the one nitride semiconductor layer and the step of growing the adjacent nitride semiconductor layer are preferably conducted at different growth temperatures. In general, a nitride semiconductor mainly including gallium is grown at a growth temperature exceeding 1000° C. However, when the nitride semiconductor layer includes an element such as indium having a high vapor pressure during the growth, the re-evaporation of nitrogen from indium nitride can be suppressed by setting the growth temperature to a lower temperature. Thus, the crystal quality can be definitely improved.

The second method of fabricating a nitride semiconductor device of this invention comprises the steps of forming plural seed crystals on a substrate: selectively growing, on the substrate, a first nitride semiconductor layer from the plural seed crystals under a first growth ambient pressure; and growing, on the first nitride semiconductor layer, a second nitride semiconductor layer under a second growth ambient pressure different from the first growth ambient pressure.

According to the second method of fabricating a nitride semiconductor device, in the first nitride semiconductor layer grown from the plural seed crystals in the lateral direction (the direction along the substrate surface), the lateral growth can be accelerated when it is grown under the first growth ambient pressure of, for example, reduced pressure. Therefore, the nitride semiconductor layer with a flat face can be formed over the substrate. Furthermore, when the second nitride semiconductor layer grown on the first nitride semiconductor layer is grown under the second ambient pressure different from the first ambient pressure, for example, under an optimal ambient pressure as in the first method of fabricating a nitride semiconductor device, the nitride semiconductor device with good quality can be formed on the first nitride semiconductor layer including few defects.

In the second method of fabricating a nitride semiconductor device, the first growth ambient pressure is preferably lower than the atmospheric pressure.

In the second method of fabricating a nitride semiconductor device, a first growth temperature employed for growing the first nitride semiconductor layer and a second growth temperature employed for growing the second nitride semiconductor layer are preferably different from each other. In this manner, the crystal growth of the first nitride semiconductor layer and the second nitride semiconductor layer grown thereon can be individually optimized.

In this case, the second growth temperature is preferably higher than the first growth temperature. In this manner, the crystal orientation of the second nitride semiconductor layer can be further improved.

In the second method of fabricating a nitride semiconductor device, the first nitride semiconductor layer preferably includes aluminum. In this manner, the surface of the first nitride semiconductor layer can be rigid, so as to prevent the surface of the first nitride semiconductor layer from degrading before starting growing the second nitride semiconductor layer. As a result, the crystallinity of the second nitride semiconductor layer can be improved.

BRIEF DESCRIPTION OF THE DRAWINGS

FIGS. 5(a), 5(b) and 5(c) show dependency on growth pressure of a nitride semiconductor layer in the method of fabricating a nitride semiconductor laser diode of Embodiment 1, wherein FIG. 5(a) is a graph of the dependency on growth pressure of a growth rate of aluminum gallium nitride, FIG. 5(b) is a graph of the dependency on growth pressure of a concentration of magnesium introduced into gallium nitride and FIG. 5(c) is a graph of the dependency on growth pressure of a concentration of magnesium introduced into aluminum gallium nitride;

DETAILED DESCRIPTION OF THE INVENTION

Embodiment 1

Embodiment 1 of the invention will now be described with reference to the accompanying drawings.

FIGS. 1(a) through 1(c) and 2 are sectional views for showing procedures in a method of fabricating a nitride semiconductor laser diode of Embodiment 1.

Figure 1A:
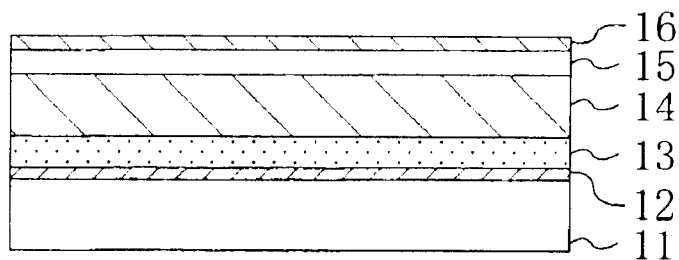
FIGS. 1(a), 1(b) and 1(c) are cross-sectional views for showing procedures in a method of fabricating a nitride semiconductor laser diode according to Embodiment 1 of the invention.

First, as is shown in FIG. 1(a), with a growth temperature set to approximately 500° C., trimethylgallium (TMG) serving as a gallium source and ammonia ($NH_3$) serving as a nitrogen source are introduced onto a substrate 11 of sapphire by metal organic vapor phase epitaxial growth (MOVPE), so as to form a buffer layer 12 of GaN for relaxing lattice mismatch between sapphire and a gallium nitride-based semiconductor. Then, after the substrate temperature is increased to approximately 1020° C., TMG serving as a gallium source, trimethylaluminum (TMA) serving as an aluminum source, if necessary, $NH_3$ serving as a nitrogen source and monosilane ($SiH_4$) including silicon serving as an n-type dopant are introduced onto the substrate 11, so as to successively grow, on the buffer layer 12, an n-type contact layer 13 of n-type GaN, a first cladding layer 14 of n-type $Al_{0.1}Ga_{0.9}N$, a first light guiding layer 15 of n-type GaN and a first protection layer 16 of n-type $Al_{0.2}Ga_{0.8}N$. In this case, hydrogen is mainly used as a carrier gas, a growth ambient pressure (hereinafter simply referred to as the growth pressure) is set to approximately 300 Torr (approximately 0.4 atm) lower than the atmospheric pressure, whereas 1 Torr is approximately 133.322 Pa.

Figure 1B:
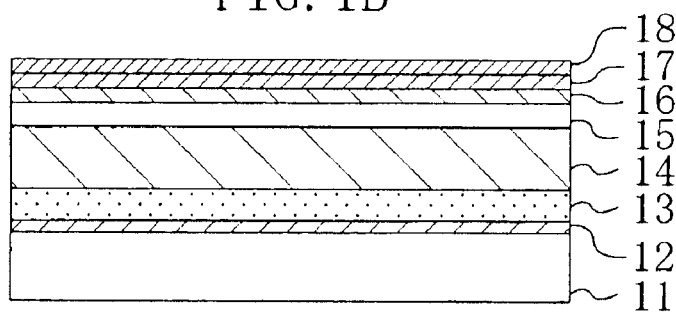
Figure 1C:
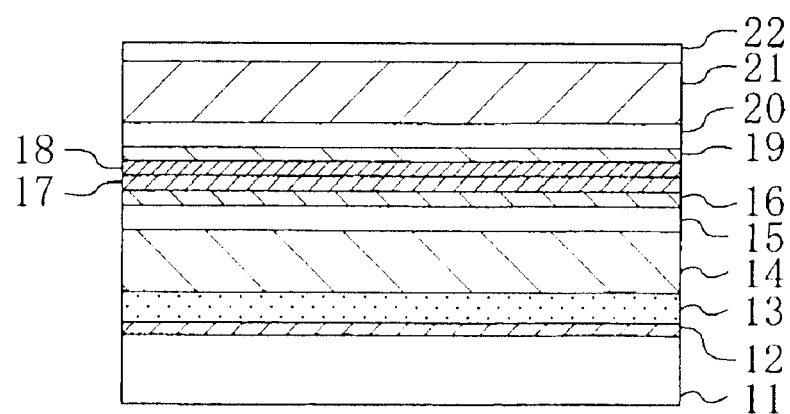

Next, as is shown in FIG. 1(b), the introduction of the group III material gases is stopped, the growth pressure is changed to increased pressure of approximately 840 Torr (approximately 1.1 atm) and the growth temperature is lowered to approximately 780 through 800° C. At this point, while the introduction of the group III material gases is stopped, the crystal face of the first protection layer 16 is placed in an equilibrium state, but degradation in the face flatness can be avoided because the bonding strength between the constituent atoms is high in the first protection layer including aluminum (Al).

Furthermore, after changing the carrier gas from hydrogen to nitrogen. TMG, $NH_3$ and $SiH_4$ are introduced onto the substrate 11, so as to grow a second protection layer 17 of n-type GaN on the first protection layer 16. Subsequently, the introduction of $SiH_4$ is stopped, and a multiple quantum well (MQW) active layer 18 is grown on the second protection layer 17 with the ratio of introducing trimethylindium (TMI) and TMG changed between a well layer and a barrier layer. In this case, the MQW active layer 18 includes, for example, three cycles of the well layer of $In_{0.09}Ga_{0.91}N$ with a thickness of approximately 3 nm and the barrier layer of $In_{0.01}Ga_{0.99}N$ with a thickness of approximately 6 nm. The MQW active layer 18 may additionally include a dopant such as silicon. Also, the carrier gas may be an inert gas such as argon instead of nitrogen.

Next, as is shown in FIG. 1(o), with keeping the increased pressure, TMG, TMA, $NH_3$ and $Cp_2Mg$ serving as a p-type dopant are introduced onto the substrate 11 while increasing the growth temperature to approximately 1020° C., so as to grow, on the MQW active layer 18, an evaporation suppressing layer 19 of p-type AlGaN for suppressing re-evaporation of nitrogen included in the MQW active layer 18. Thereafter, the introduction of the group III material gases is stopped, and the growth pressure is set again to reduced pressure of approximately 400 Torr (approximately 0.53 atm). After the growth pressure and the growth temperature attain the set values, TMG, TMA if necessary, $NH_3$ and cyclopentadienylmagnesium ($Cp_2Mg$) serving as the p-type dopant are introduced onto the substrate 11, so as to successively grown, on the evaporation suppressing layer 19, a second light guiding layer 20 of p-type GaN, a second cladding layer 21 of p-type $Al_{0.1}Ga_{0.9}N$ and a p-type contact layer 22 of p-type GaN.

The evaporation suppressing layer 19 is grown with the growth pressure set to the increased pressure as in growing the MQW active layer 18 while increasing the growth temperature for the purpose of preventing indium nitride (InN) included in the MQW active layer 18 from degrading in its crystal quality through decomposition during the temperature increase. When the growth rate is sufficiently small, for example, approximately 1 nm/min., the evaporation suppressing layer 19 can sufficiently exhibit its function against the MQW active layer 18. In addition, when the evaporation suppressing layer 19 sufficiently covers the MQW active layer 18, the MQW active layer 18 can be free from damage even if the growth pressure is changed from the increased pressure to the reduced pressure and the carrier gas is changed from nitrogen to hydrogen.

Figure 2:
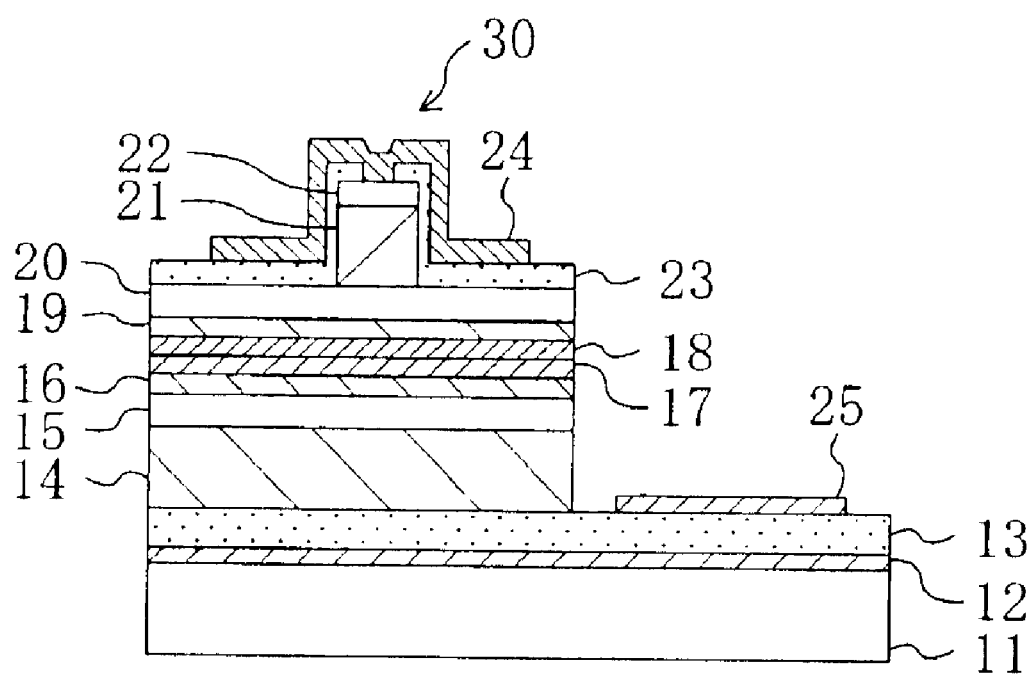
FIG. 2 is a cross-sectional view for showing another procedure in the method of fabricating a nitride semiconductor laser diode of Embodiment 1.

Next, as is shown in FIG. 2, the second cladding layer 21 and the p-type contact layer 22 are etched so as to form a ridge 30 with a width of approximately 5 μm. Subsequently, an insulating film 23 of silicon oxide ($SiO_2$) is formed over the second light guiding layer 20 including the top and side faces of the ridge 30 by CVD or the like. Then, the n-type contact layer 13 is etched so as to expose a portion on a side of the ridge 30.

Subsequently, an opening is formed in the insulating film 23 on the ridge 30, and a p-side electrode 24 including stacked layers of, for example, nickel (Ni) and gold (Au) is formed by evaporation or the like so as to cover the ridge 30 and be in ohmic contact with the p-type contact layer 22 through the opening.

Furthermore, an n-side electrode 25 including stacked layers of, for example, titanium (Ti) and aluminum (Al) is formed by the evaporation or the like on the exposed portion of the n-type contact layer 13.

In the nitride semiconductor laser diode thus fabricated, when a predetermined voltage is applied to the p-side electrode 24 with the n-side electrode 25 grounded, holes and electrons are injected respectively from the p-side electrode 24 and the n-side electrode 25 into the MQW active layer 18, so as to generate optical gain within the MQW active layer 18, resulting in showing laser action at a wavelength of approximately 405 nm.

In this embodiment, the crystal quality of the MQW active layer 18 is suppressed from degrading by forming the first protection layer 16 of n-type $Al_{0.2}Ga_{0.8}N$ and the second protection layer 17 of n-type GaN below the MQW active layer 18 and forming the evaporation suppressing layer 19 of p-type AlGaN on the MQW active layer 18, but these protection layers and the like are not indispensable members of the laser diode.

Furthermore, although the substrate 11 is made from sapphire, the substrate may be made from silicon carbide (SiC) or silicon (Si) instead of sapphire or may be a silicon substrate whose upper portion is carbonated.

Figure 3:
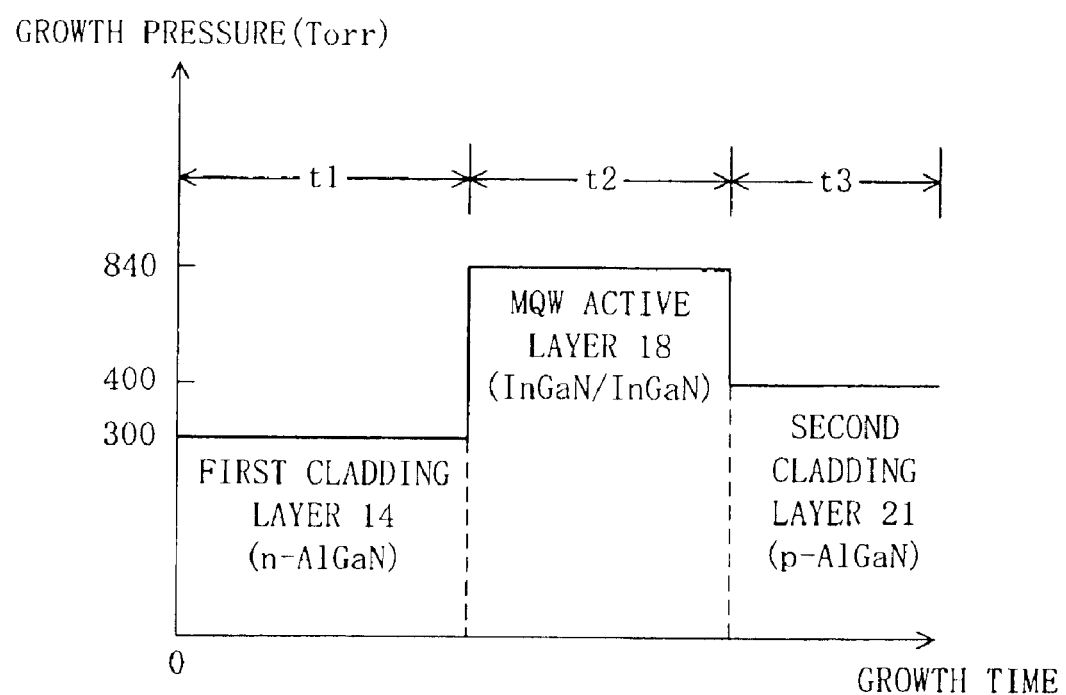
FIG. 3 is a graph for showing change with time of growth pressure employed in the method of fabricating a nitride semiconductor laser diode of Embodiment 1.

FIG. 3 shows change with time of the growth pressure in the method of fabricating a nitride semiconductor laser diode of this embodiment.

As is shown in FIG. 3, in first growth pressure time t1 in which the growth pressure is approximately 300 Torr, the buffer layer 12, the n-type contact layer 13, the first cladding layer 14, the first light guiding layer 15 and the first protection layer 16 are successively grown. Then, in second growth pressure time t2 in which the growth pressure is approximately 840 Torr, the second protection layer 17, the MQW active layer 18 and the evaporation suppressing layer 19 are successively grown. Subsequently, in third growth pressure time t3 in which the growth pressure is approximately 400 Torr, the second light guiding layer 20, the second cladding layer 21 and the p-type contact layer 22 are successively grown.

Now, a pressure variable MOVPE system capable of changing the growth pressure as is shown in FIG. 3 will be described with reference to the accompanying drawing.

Figure 4:
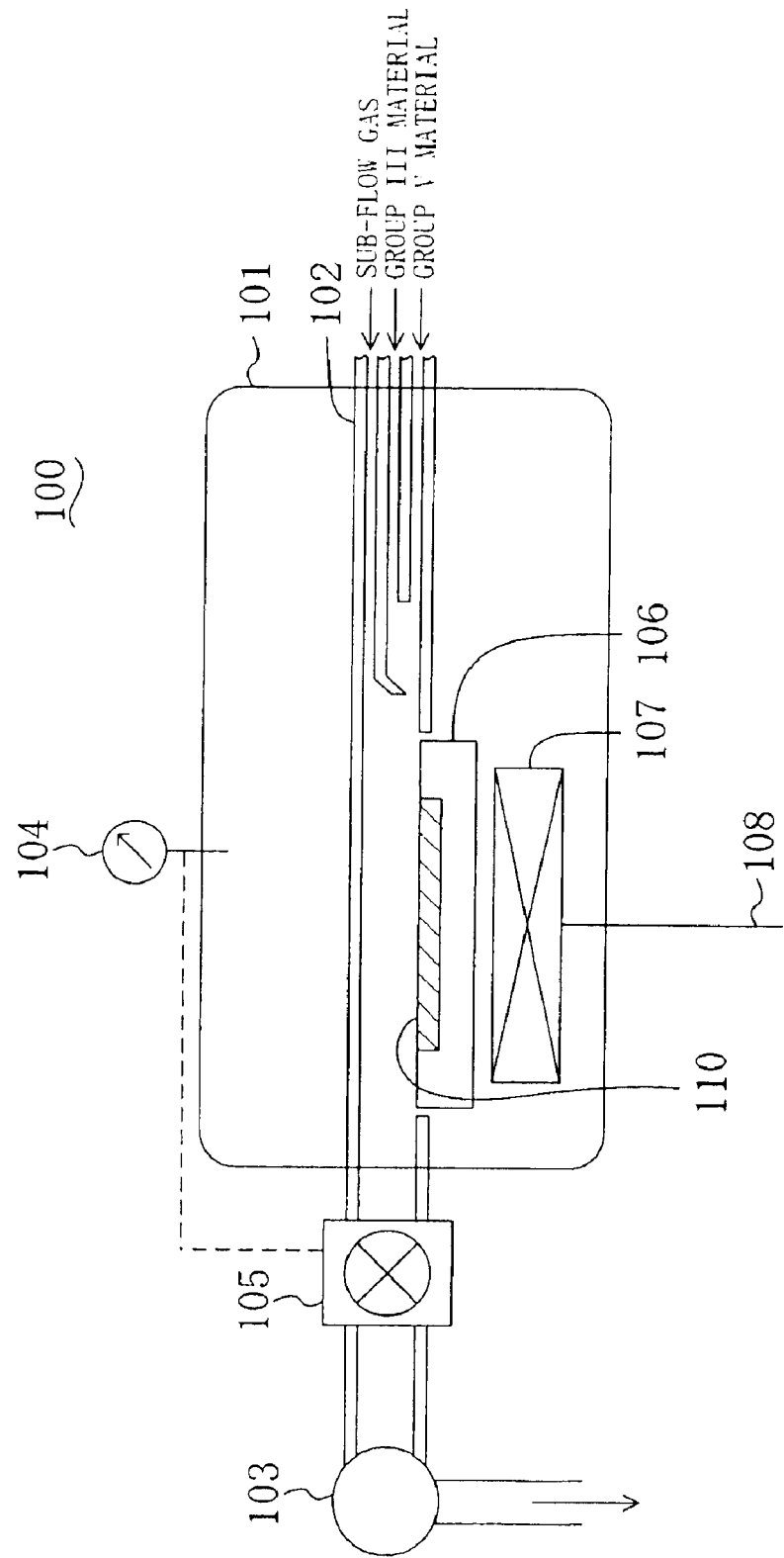
FIG. 4 is a schematic front view of a pressure variable MOVPE system of Embodiment 1.

FIG. 4 schematically shows the pressure variable MOVPE system according to this embodiment. As is shown in FIG. 4, the pressure variable MOVPE system 100 includes a reaction chamber 101; an inlet tube 102 of stainless steel or quartz for introducing material gases and carrier gases for carrying the material gases into the reaction chamber 101; a rotary pump 103 disposed on the exhausting side of the inlet tube 102 for exhausting unnecessary material gases and the like from the reaction chamber 101; and a conductance valve 105 disposed between the reaction chamber 101 and the rotary pump 103, which is opened or closed in accordance with a pressure gauge 104 for measuring the pressure within the reaction chamber 101 so as to adjust the pressure within the reaction chamber 101 to the atmospheric pressure, reduced pressure lower than the atmospheric pressure or increased pressure up to several atm.

Partitions are provided within the inlet tube 102 so that a group III material source, a group V material source and a sub-flow gas can be independently introduced to the vicinity of a substrate. The sub-flow gas is nitrogen, hydrogen or an inert gas such as argon, and is introduced in parallel with material gases for suppressing the material gasses from blowing up above the substrate due to a convection or the like.

The inlet tube 102 is provided with a window on its side facing the bottom of the reaction chamber 101. A susceptor 106 for supporting a substrate 110 on its lower and side faces is fit in the window, and the top face of the susceptor 106 is placed at the same level as the inner wall of the inlet tube 102.

A heater 107 for heating the substrate 110 is disposed below the susceptor 106 within the reaction chamber 101. The heater 107 is externally monitored through, for example, a thermoelectric couple 108 for adjusting the temperature of the substrate 110 to a desired temperature.

Now, the characteristic and the effectiveness of variable MOVPE where the growth pressure is changed during the growth of nitride semiconductors will be described with reference to FIGS. 5(a) through 5(c).

Figure 5A:
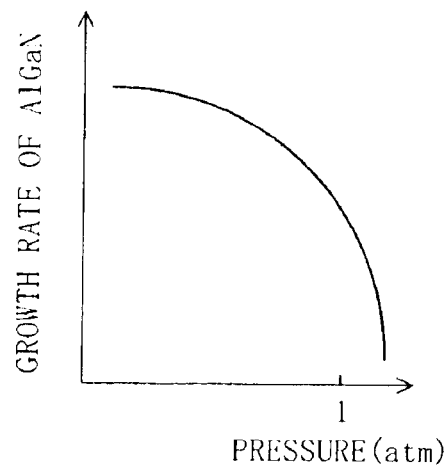

FIG. 5(a) shows dependency on the growth pressure of a growth rate of aluminum gallium nitride (AlGaN). As is shown in FIG. 5(a), as the growth pressure is higher, the growth rate is lower. In particular, when the growth pressure exceeds approximately 1 atm, the growth rate is excessively lowered.

Figure 5B:
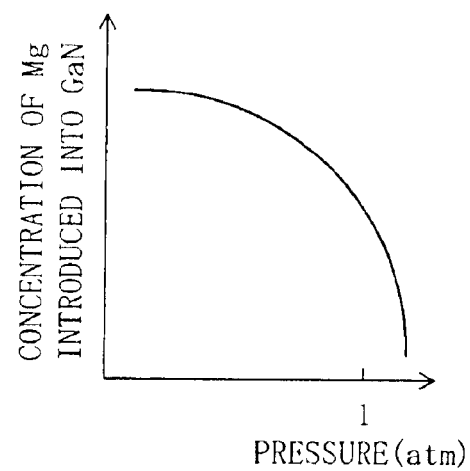

FIG. 5(b) shows dependency on the growth pressure of a concentration of magnesium (Mg) introduced into gallium nitride (GaN). As is shown in FIG. 5(b), the concentration of Mg introduced into p-type GaN is more largely lowered as the growth pressure increases. In particular, when the growth pressure exceeds approximately 1 atm, the concentration of Mg is excessively lowered.

This is probably because the probability of collision between the materials is increased in a vapor phase when the growth pressure is high, and in particular, an intermediate reaction is caused between trimethylaluminum (TMA) and ammonia ($NH_3$) or between cyclopentadienylmagnesium ($Cp_2Mg$) and ammonia ($NH_3$), so that the materials cannot be efficiently supplied onto the substrate.

Figure 5C:
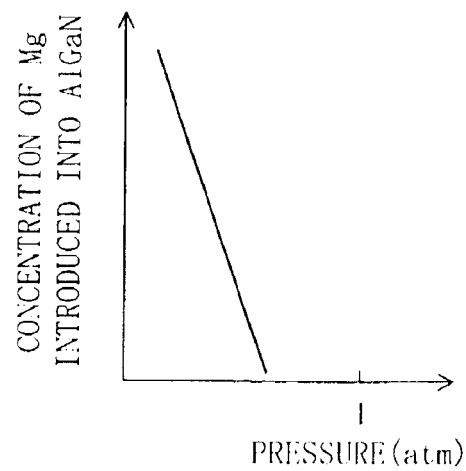

In proof of this, the concentration of magnesium (Mg) introduced into aluminum gallium nitride (AlGaN) shown in FIG. 5(c) is more largely lowered as the growth pressure increases than that introduced into gallium nitride shown in FIG. 5(b).

Accordingly, a semiconductor layer of p-type AlGaN is very efficiently grown under reduced pressure lower than the atmospheric pressure.

On the other hand, a gallium nitride-based semiconductor including indium is efficiently grown at a low temperature or under high growth pressure for suppressing re-evaporation of nitrogen because indium nitride (InN) has such a high vapor pressure that it is necessary to suppress defects due to release of nitrogen. Accordingly, a gallium nitride-based semiconductor including indium is conventionally generally grown by atmospheric MOVPE conducted under the atmospheric pressure and is sometimes grown by increased pressure MOVPE.

In the conventional atmospheric MOVPE and the increased pressure MOVPE, however, the growth pressure is always set to a fixed value. Accordingly, there has been no disclosure of a growth method in which the growth pressure is changed, specifically, increased pressure is employed in growing the MQW active layer 18 of a gallium nitride-based semiconductor including In for attaining high crystal quality and reduced pressure is subsequently employed in growing the second light guiding layer 20, the second cladding layer 21 and the like of gallium nitride-based semiconductors including Al or Mg for suppressing the production of intermediate reaction products in the vapor phase as in this embodiment.

Now, in order to suppress the production of intermediate reaction products, a method for reducing the probability of collision between the materials by lowering the concentrations of the material gases instead of employing reduced pressure as in this embodiment will be verified.

Figure 6:
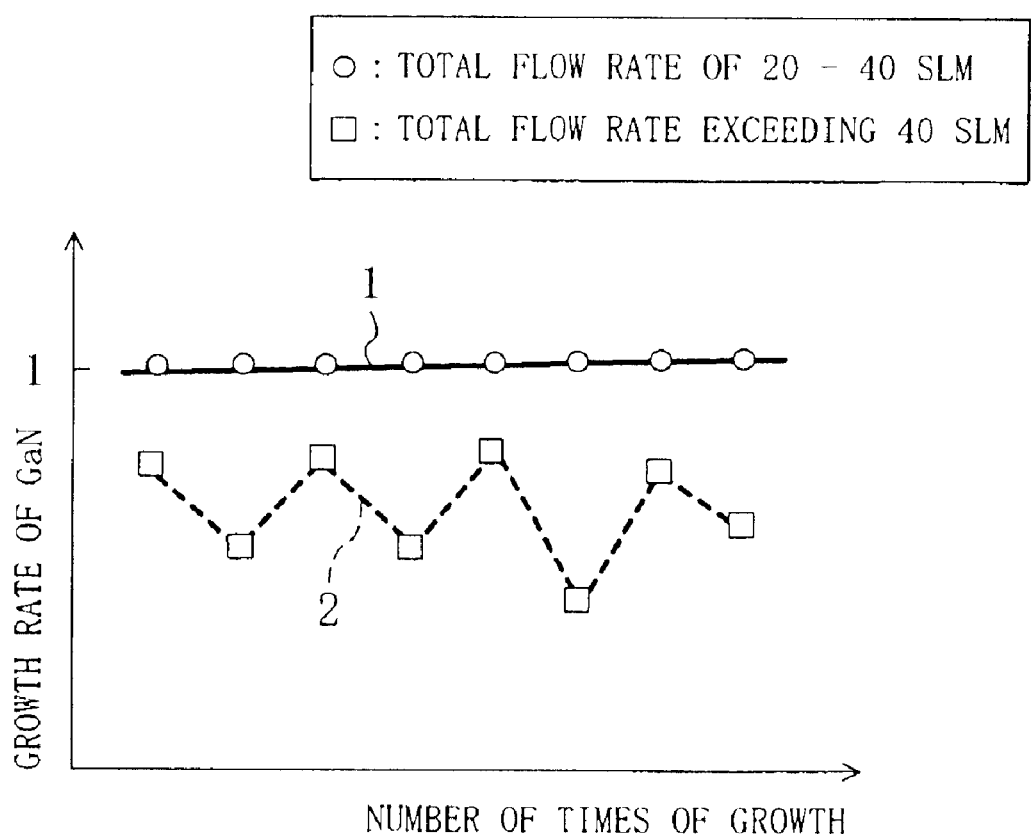
FIG. 6 is a graph for showing the relationship between a growth rate of gallium nitride and a total flow rate of material gasses and carrier gases in the method of fabricating a nitride semiconductor laser diode of Embodiment 1.

FIG. 6 shows the relationship between a growth rate of gallium nitride and a total flow rate of material gases and a carrier gas. In FIG. 6, the abscissa indicates the number of times of growth and the ordinate indicates the growth rate of gallium nitride. Also, the growth pressure is set to approximately 840 Torr (approximately 1.1 atm) and the total flow rate is adjusted by increasing/decreasing the flow rate of hydrogen or nitrogen serving as a carrier gas for a group III material.

In the case shown with a solid line 1 in FIG. 6 where the total flow rate is 20 through 40 slm (standard liter per minute) and a vapor phase intermediate reaction occurs, the growth rate of gallium nitride is substantially constant and stable through repeated growth. In contrast, in the case shown with a broken line 2 where the total flow rate exceeds 40 slm, the flow rate is so high that the growth rate is lowered because the efficiency of thermal decomposition of the materials is degraded or that the air flow is unstably changed due to vortexes or a small amount of reaction product generated therein. As a result, the growth rate becomes more and more unstable through repeated growth.

Therefore, when the pressure variable MOVPE is employed, an active layer of a nitride semiconductor including indium is grown under increased pressure so as to reduce defects resulting from holes from which nitrogen has been released, and a nitride semiconductor not including indium is grown under reduced pressure so as to suppress the vapor phase intermediate reaction. As a result, crystals can be stably and highly efficiently grown.

Furthermore, the present inventors have found that when a nitride semiconductor including indium is grown under increased pressure, the growth temperature can be higher than the case where the increased pressure is not employed.

Figure 7:
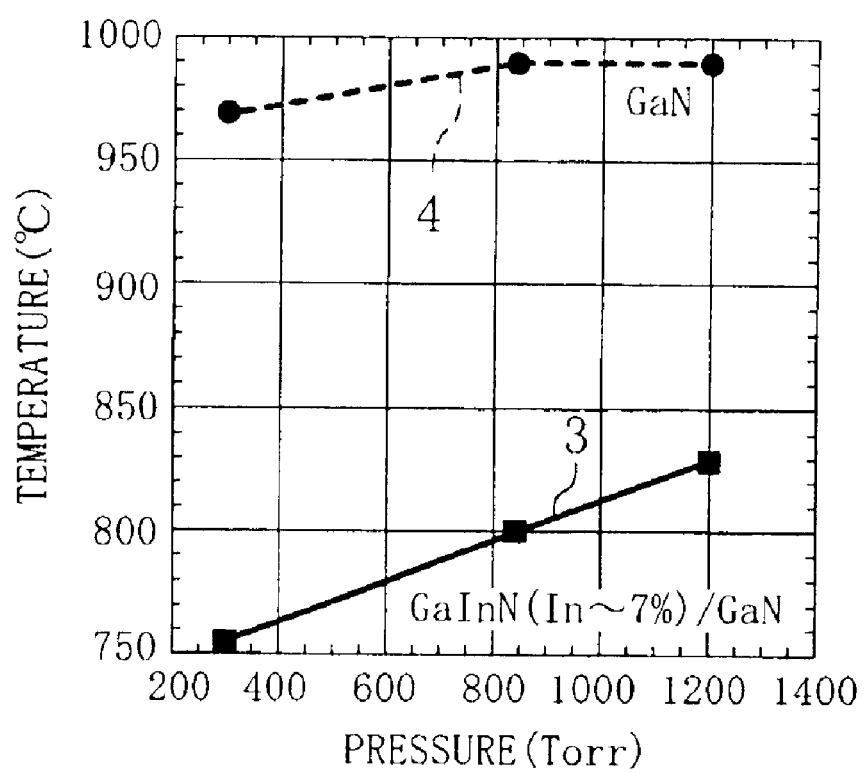
FIG. 7 is a graph for showing dependency on growth pressure of an optimal growth temperature for a nitride semiconductor including indium in the method of fabricating a nitride semiconductor laser diode of Embodiment 1.

FIG. 7 shows dependency on growth pressure of an optimal growth temperature of a nitride semiconductor including indium, wherein the abscissa indicates the growth pressure and the ordinate indicates the growth temperature. In FIG. 7, a solid line 3 shows the dependency obtained in a MQW layer including three cycles of InGaN including indium in a composition ratio smaller than 7% and GaN, and a broken line 4 shows the dependency obtained in a GaN layer.

As is shown in FIG. 7, when the growth pressure is 840 Torr (approximately 1.1 atm), the optimal growth temperature of the MQW layer 3 is approximately 800° C., which is lower than that of the GaN layer 4 by approximately 190° C. Furthermore, when the growth pressure is increased to 1200 Torr (approximately 1.6 atm), the optimal growth temperature of the MQW layer 3 is approximately 830° C., which is lower than that of the GaN layer 4 by approximately 160° C. On the other hand, when the growth pressure is reduced to 300 Torr (approximately 0.4 atm), the optimal growth temperature of the MQW layer 3 is approximately 755° C., which is lower than that of the GaN layer 4 by approximately 215° C. In this manner, the optimal growth temperature of the MQW layer 3 including indium is higher when it is grown under increased pressure than when it is grown under reduced pressure.

Therefore, when an active layer including indium is grown under increased pressure, it can be grown at a higher temperature, so as to further improve the crystallinity of the active layer. In addition, a temperature difference from the growth temperature of p-type GaN and p-type AlGaN, of approximately 1000° C., to be grown on the active layer can be made small, and hence, damage of the active layer due to the temperature difference can be reduced in increasing the temperature to the growth temperature of the semiconductor layers to be grown on the active layer.

The semiconductor laser diode of FIG. 2 thus fabricated by the pressure variable growth method of this embodiment has a threshold current approximately ½ as small as that of a conventional laser diode.

Although the active layer is grown under increased pressure higher than the atmospheric pressure and the semiconductor layers other than the active layer are grown under reduced pressure in this embodiment, the semiconductor layers other than a p-type GaN layer and a p-type AlGaN layer, where it is necessary to suppress the production of the intermediate reaction products, may be grown under pressure equivalent to or higher than the atmospheric pressure. This is because the vapor phase intermediate reaction is substantially negligible in the growth of a semiconductor layer not including aluminum and magnesium. Furthermore, in changing the growth pressure, there is no need to always stop the growth but a subsequent layer may be continuously grown by lowering the growth rate by, for example, reducing the supply amount of the group III material.

Furthermore, although the method of fabricating a gallium nitride-based semiconductor laser diode is described in this embodiment, the method is also very effective in growing an active region of a light emitting diode device or an electronic device. For example, when this method is employed, the luminous efficiency can be largely improved in a light emitting diode device, and the mobility of carriers in an active layer can be increased in an electronic device.

Embodiment 2

Embodiment 2 of the invention will now be described with reference to the accompanying drawings.

In Embodiment 1, in order to improve the crystal quality of an active layer and reduce products generated through the vapor phase intermediate reaction between material gases, the growth pressure is set to different values between the growth of the active layer and the growth of semiconductor layers sandwiching the active layer and having a smaller refractive index than the active layer. In Embodiment 2, another method for improving the quality of the active layer will be described.

Figure 8:
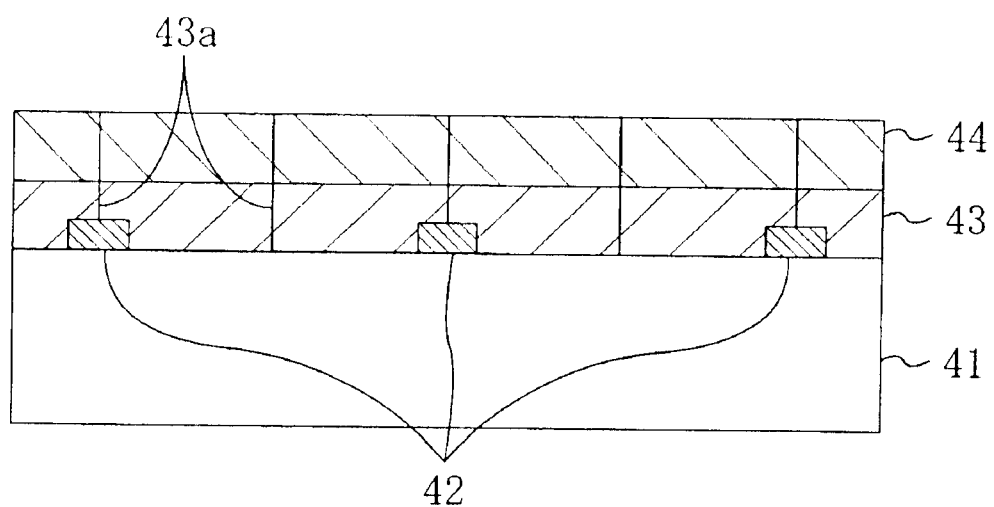
FIG. 8 is a cross-sectional view for showing a procedure in a method of fabricating a nitride semiconductor laser diode according to Embodiment 2 of the invention.
Figure 9:
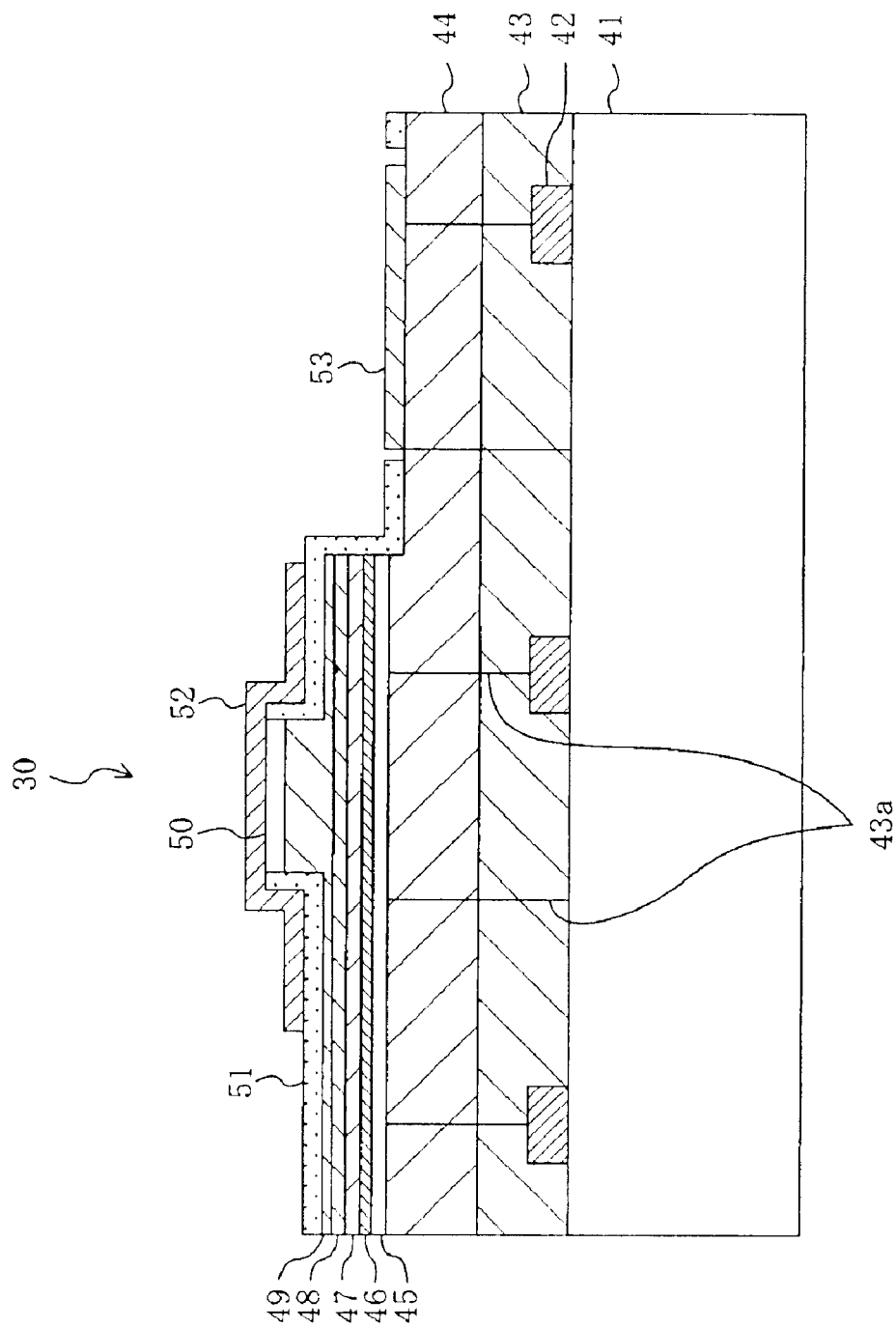
FIG. 9 is a cross-sectional view for showing another procedure in the method of fabricating a nitride semiconductor laser diode of Embodiment 2.

FIGS. 8 and 9 are sectional views for showing procedures in a method of fabricating a nitride semiconductor laser diode of Embodiment 2.

First, as is shown in FIG. 8, seed crystal layers 42 of GaN in the shape of plural ridge stripes extending at intervals are formed on a substrate of, for example, sapphire. The seed crystal layers 42 can be formed, for example, by growing a semiconductor layer of GaN in a predetermined thickness on the substrate by the MOVPE or the like and patterning the semiconductor layer by known photolithography and etching. Alternatively, the seed crystal layers 42 may be formed by depositing, on the substrate 41, a mask pattern of a dielectric film of silicon oxide or the like having plural stripe-shaped openings and conducting epitaxial lateral overgrowth (ELO) by using the mask pattern.

Then, with the growth pressure set to approximately 100 Torr (approximately 0.13 atm) and with the substrate temperature set to approximately 950° C., material gases, namely, trimethylgallium (TMG), trimethylaluminum (TMA), ammonia ($NH_3$) and monosilane ($SiH_4$) including an n-type dopant are introduced onto the substrate 41 by the MOVPE. Thus, a flattening layer 43 of n-type AlGaN is grown on the substrate 41 through the ELO from the side faces of the seed crystal layers 42 so as to be integrated and have a flat top face.

Next, with the growth pressure set to approximately 300 Torr (approximately 0.4 atm) and with the substrate temperature set to approximately 1050° C., TMG, TMA, $NH_3$ and $SiH_4$ are introduced onto the substrate 41, so as to grow a first cladding layer 44 of n-type AlGaN on the flattening layer 43. A line 43a vertical to the substrate surface formed in the flattening layer 43 above each seed crystal layer 42 or between the seed crystal layers 42 corresponds to a junction where crystals respectively grown from the seed crystal layers 42 meet each other before forming the integrated flattening layer 43.

Also at this point, the present inventors have found the following: When the flattening layer 43 of n-type AlGaN is grown at a low growth temperature so that the materials can be easily deposited in the vicinity of the side faces of the respective seed crystal layers 42 on the substrate 41 with the collision of the materials suppressed by setting the growth pressure to reduced pressure of 100 Torr so that the flattening layer 43 can be uniformly grown from the side faces of the seed crystal layers 42 in a lateral direction (a direction parallel to the substrate surface), the quality of a semiconductor crystal subsequently grown on the flattening layer 43 can be effectively improved.

Furthermore, it has been found that since the flattening layer 43 grown at a low temperature is poor in the crystallinity such as the C-axis orientation, when the first cladding layer 44 is grown at a growth temperature higher than that for the flattening layer 43 by approximately 100° C., the crystallinity of the first cladding layer 44 can be improved.

Although the flattening layer 43 is made from n-type AlGaN in this embodiment, it may not include aluminum or may not be of n-type. However, the flattening layer 43 preferably includes aluminum because surface degradation of the flattening layer 43 can be thus avoided in increasing the growth pressure from 100 Torr to 300 Torr for growing the first cladding layer 44.

The surface of the thus obtained first cladding layer 44 is etched by using an etchant including phosphoric acid and sulfuric acid and the etch pit density of the etched surface is observed. Thus, it is confirmed that the etch pit density is reduced by approximately two figures as compared with that in n-type AlGaN obtained by a conventional method.

Although the substrate 41 is made from sapphire in this embodiment, the substrate may be made from silicon carbide (SiC) or silicon (Si) instead of sapphire or may be a silicon substrate whose upper portion is carbonated.

The seed crystal layer 42 is not limited to GaN but may include Al or In because it can serve as a seed crystal of AlGaN even when it includes Al or In.

Next, as is shown in FIG. 9, respective nitride semiconductor layers constructing the laser diode are grown in the same manner as in Embodiment 1.

Specifically, with the substrate temperature set to approximately 1050° C. and the growth pressure set to approximately 300 Torr (approximately 0.4 atm), TMG, $NH_3$ and $SiH_4$ are introduced onto the substrate 41, so as to grow a first light guiding layer 45 of n-type GaN on the first cladding layer 44.

Subsequently, with the introduction of the group III material gases stopped, the growth pressure set to increased pressure of approximately 840 Torr (approximately 1.1 atm), the growth temperature lowered to approximately 780 through 800° C. and the carrier gas changed from hydrogen to nitrogen, TMI, TMG and $NH_3$ are introduced onto the substrate 41, so as to grow, on the first light guiding layer 45, a MQW active layer 46 including stacked InGaN layers respectively having different composition ratios of In.

While keeping the increased pressure and increasing the growth temperature to approximately 1020 through 1050° C., TMG, TMA, $NH_3$ and $Cp_2Mg$ are introduced onto the substrate 41, so as to grow an evaporation suppressing layer 47 of p-type AlGaN on the MQW active layer 46. Thereafter, with the introduction of the group III material gases stopped and the growth pressure set again to reduced pressure of approximately 400 Torr (approximately 0.53 atm), TMG, TMA if necessary, $NH_3$ and $Cp_2Mg$ are introduced onto the substrate 41, so as to successively grow, on the evaporation suppressing layer 47, a second light guiding layer 48 of p-type GaN, a second cladding layer 49 of p-type AlGaN and a p-type contact layer 50 of p-type GaN.

Thereafter, an upper portion of the second cladding layer 49 and the p-type contact layer 50 are formed into a ridge 30, and an insulating film 51 is formed so as to cover the remaining portion of the second cladding layer 49 including the ridge 30. At this point, since a crystal above every junction 43a of the flattening layer 43 has a high dislocation density, the ridge 30 is preferably formed in a region not including a portion above the junction 43a.

Subsequently, a p-side electrode 52 is formed so as to cover the ridge 30, and an n-side electrode 53 is formed on an exposed portion of the first cladding layer 44.

In the semiconductor laser diode of this embodiment, the threshold current can be reduced to approximately ½ of that of a laser diode fabricated by a conventional method. Furthermore, the present laser diode can be continuously operated at room temperature for more than 10000 hours, and it is thus confirmed that the life can be remarkably improved.

Figure 10:
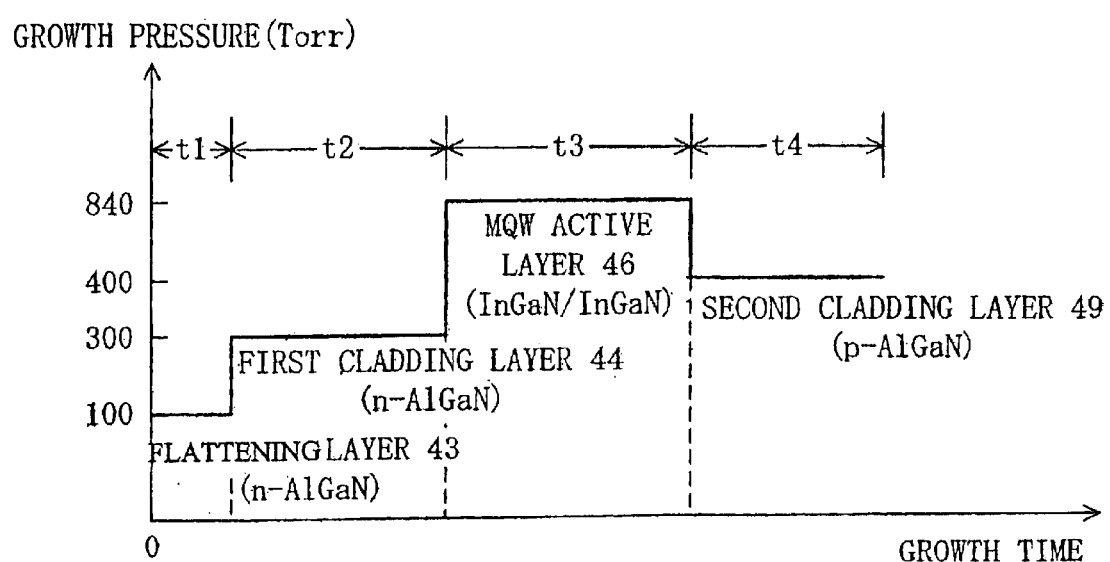
FIG. 10 is a graph for showing change with time of a growth pressure employed in the method of fabricating a nitride semiconductor laser diode of Embodiment 2.
Figure 11:
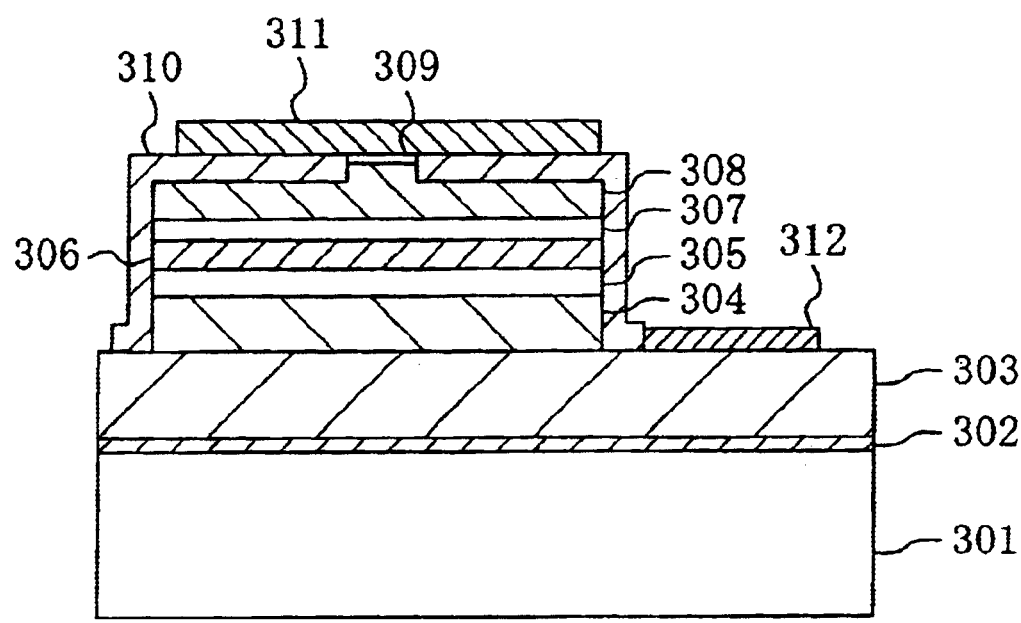
FIG. 11 is a cross-sectional view for showing the structure of a conventional nitride semiconductor laser diode.

FIG. 10 shows change with time of the growth pressure in the method of fabricating a nitride semiconductor laser diode of this embodiment.

As is shown in FIG. 10, in first growth pressure time t1 in which the growth pressure is approximately 100 Torr, the flattening layer 43 is grown. Next, in second growth pressure time t2 in which the growth pressure is approximately 300 Torr, the second cladding layer 44 and the first light guiding layer 45 are successively grown. Subsequently, in third growth pressure time t3 in which the growth pressure is approximately 840 Torr, the MQW active layer 46 and the evaporation suppressing layer 47 are successively grown. Then, in fourth growth pressure time t4 in which the growth pressure is approximately 400 Torr, the second light guiding layer 48, the second cladding layer 49 and the n-type contact layer 50 are successively grown.

As described above, according to this embodiment, very low pressure of 100 Torr is employed in growing the flattening layer 43 from the seed crystal layers 42 through the ELO, reduced pressure of 300 Torr is employed in growing the first cladding layer 44 on the flattening layer 43, and the growth temperature is higher in growing the first cladding layer 44 by approximately 100° C. than in growing the flattening layer 43. Accordingly, even though the ELO is employed, the crystallinity of the MQW active layer 46 grown on the first cladding layer 44 can be further improved.

In addition, similarly to Embodiment 1, the growth pressure is set to increased pressure in growing a semiconductor layer where re-evaporation is easily caused, and is set to reduced pressure in growing a semiconductor layer where an intermediate reaction product is easily produced. Since optimal growth pressures are thus selected, it is possible to form the MQW active layer 46 of InGaN with high quality on the first cladding layer 44 of n-type AlGaN having a low defect density.

Accordingly, in the growth of a semiconductor layer including aluminum or magnesium where an intermediate reaction product is easily produced, the vapor phase intermediate reaction can be suppressed, so as to efficiently and stably grow a semiconductor of p-type AlGaN or p-type GaN.

Also in this embodiment, at least one of a first protection layer of n-type AlGaN and a second protection layer of n-type GaN can be formed between the first light guiding layer 45 and the MQW active layer 46.

Moreover, although the active layer is grown under increased pressure higher than the atmospheric pressure and the semiconductor layers other than the active layer are grown under reduced pressure in this embodiment, semiconductor layers other than a p-type GaN layer and a p-type AlGaN layer where it is necessary to suppress the production of the intermediate reaction products may be grown under a pressure equivalent to or higher than the atmospheric pressure.

Furthermore, although the method of fabricating a gallium nitride-based semiconductor laser diode is described in this embodiment, the method is also very effective in growing an active region of a light emitting diode device or an electronic device. For example, when this method is employed, the luminous efficiency can be largely improved in a light emitting diode device, and the mobility of carriers in an active layer can be increased in an electronic device.

The method of fabricating a nitride semiconductor of Embodiment 1 or 2 is applicable not only to the MOVPE but also to any method capable of growing a nitride semiconductor layer such as hydride vapor phase epitaxial growth (HVPE) and molecular beam epitaxial growth (MBE).

What is claimed is:

1. A method of fabricating a nitride semiconductor device by a vapor deposition method comprising the steps of:

forming plural seed crystals on a substrate;

selectively growing, on said substrate, a first nitride semiconductor layer including aluminum from said plural seed crystals under a first growth ambient pressure; and growing, on said first nitride semiconductor layer, a second nitride semiconductor layer under a second growth ambient pressure different from said first growth ambient pressure, wherein said first growth ambient pressure is lower than said second growth ambient pressure, and is lower than the atmospheric pressure.

2. The method of fabricating a nitride semiconductor device of claim 1, wherein a first growth temperature employed for growing said first nitride semiconductor layer and a second growth temperature employed for growing said second nitride semiconductor layer are different from each other.

3. The method of fabricating a nitride semiconductor device of claim 2, wherein said second growth temperature is higher than said first growth temperature.

* * * * *